United States Patent
Mace et al.

(10) Patent No.: US 7,760,120 B2
(45) Date of Patent: Jul. 20, 2010

(54) GENERATION METHOD OF A VARIABLE ANALOGUE SIGNAL GENERATED BY A PWM SIGNAL AND SYSTEM GENERATING SUCH A SIGNAL

(75) Inventors: Philippe Mace, Rennes (FR); Xavier Guitton, Chasne/Illet (FR); Philippe Benezeth, Cesson Sevigne (FR)

(73) Assignee: Thomson Licensing, Boulogne-Billancourt (FR)

( * ) Notice: Subject to any disclaimer, the term of this patent is extended or adjusted under 35 U.S.C. 154(b) by 86 days.

(21) Appl. No.: 12/214,939

(22) Filed: Jun. 24, 2008

(65) Prior Publication Data

US 2009/0066551 A1 Mar. 12, 2009

(30) Foreign Application Priority Data

Jun. 27, 2007 (FR) .................................. 07 56080

(51) Int. Cl.
*H03M 1/82* (2006.01)
(52) U.S. Cl. .......................... 341/152; 341/53; 327/175; 375/238
(58) Field of Classification Search .................... 341/53, 341/152; 327/172, 173, 174, 175; 375/238
See application file for complete search history.

(56) References Cited

U.S. PATENT DOCUMENTS

| | | | | |
|---|---|---|---|---|
| 3,629,710 A | * | 12/1971 | Durland | 327/175 |
| 4,330,751 A | * | 5/1982 | Swain | 327/114 |
| 6,487,246 B1 | * | 11/2002 | Hoeld | 375/238 |
| 6,765,422 B1 | * | 7/2004 | Aslan et al. | 327/175 |
| 7,151,349 B1 | | 12/2006 | Williamson et al. | |
| 2005/0099217 A1 | * | 5/2005 | Agarwal | 327/175 |
| 2006/0164142 A1 | * | 7/2006 | Stanley | 327/172 |
| 2007/0098374 A1 | * | 5/2007 | Fujiwara | 388/811 |

FOREIGN PATENT DOCUMENTS

GB 2235103 A * 2/1991

OTHER PUBLICATIONS

French Search Report dated Feb. 8, 2008.

* cited by examiner

*Primary Examiner*—Howard Williams
(74) *Attorney, Agent, or Firm*—Robert D. Shedd; Harvey D. Fried; James McKenzia

(57) ABSTRACT

The present invention relates to a generation method of a variation form of an analogue signal generated by a PWM signal whose cyclic ratio and period are programmable. A signal can thus be generated whose evolution is linear over time. A succession of generation steps of a PWM signal during which different period and cyclic ratio values are applied, as well as pairs have different periods with the same cyclic ratio, thus enabling the analogue signal to be varied with great precision. According to an improvement, each generation step of a new PWM signal with different period and cyclic ratio values is applied over time slots of equal time. The present invention also relates to a generation system of a variable analogue signal implementing the method.

14 Claims, 5 Drawing Sheets

| Decimal Value | T_ON Value | PER Value |
|---|---|---|
| 0.501960 | 128 | 255 |
| 0.501976 | 127 | 253 |
| 0.501992 | 126 | 251 |
| 0.502008 | 125 | 249 |
| 0.502024 | 124 | 247 |
| 0.502040 | 123 | 245 |
| 0.502057 | 122 | 243 |
| 0.502074 | 121 | 241 |
| 0.502092 | 120 | 239 |
| 0.502109 | 119 | 237 |
| 0.502127 | 118 | 235 |
| 0.502145 | 117 | 233 |
| 0.502164 | 116 | 231 |
| 0.502183 | 115 | 229 |
| 0.502202 | 114 | 227 |
| 0.502222 | 113 | 225 |
| 0.502242 | 112 | 223 |
| 0.502262 | 111 | 221 |
| 0.502283 | 110 | 219 |
| 0.502304 | 109 | 217 |
| 0.502325 | 108 | 215 |
| 0.502347 | 107 | 213 |
| 0.502369 | 106 | 211 |
| 0.502392 | 105 | 209 |
| 0.502415 | 104 | 207 |
| 0.502439 | 103 | 205 |
| 0.502463 | 102 | 203 |
| 0.502487 | 101 | 201 |
| 0.502512 | 100 | 199 |

| Hexa index | Dec. index | (PER, T_ON) | Decimal value |
|---|---|---|---|
| 32897: | 0x8081 | (255, 128) | 0.501960784313725 |
| 32898: | 0x8082 | (253, 127) | 0.501976284584980 |
| 32899: | 0x8083 | (251, 126) | 0.501992031872510 |
| 32900: | 0x8084 | (249, 125) | 0.502008032128514 |
| 32901: | 0x8085 | (247, 124) | 0.502024291497976 |
| 32902: | 0x8086 | (245, 123) | 0.502040816326531 |
| 32903: | 0x8087 | (243, 122) | 0.502057613168724 |
| 32904: | 0x8088 | (241, 121) | 0.502074688796680 |
| 32905: | 0x8089 | (239, 120) | 0.502092050209205 |
| 32906: | 0x808a | (237, 119) | 0.502109704641350 |
| 32907: | 0x808b | (235, 118) | 0.502127659574468 |
| 32908: | 0x808c | (235, 118) | 0.502127659574468 |
| 32909: | 0x808d | (233, 117) | 0.502145922746781 |
| 32910: | 0x808e | (231, 116) | 0.502164502164502 |
| 32911: | 0x808f | (229, 115) | 0.502183406113537 |
| 32912: | 0x8090 | (227, 114) | 0.502202643171806 |
| 32913: | 0x8091 | (227, 114) | 0.502202643171806 |
| 32914: | 0x8092 | (225, 113) | 0.502222222222222 |
| 32915: | 0x8093 | (223, 112) | 0.502242152466368 |
| 32916: | 0x8094 | (221, 111) | 0.502262443438914 |
| 32917: | 0x8095 | (221, 111) | 0.502262443438914 |
| 32918: | 0x8096 | (219, 110) | 0.502283105022831 |
| 32919: | 0x8097 | (217, 109) | 0.502304147465438 |
| 32920: | 0x8098 | (215, 108) | 0.502325581395349 |
| 32921: | 0x8099 | (215, 108) | 0.502325581395349 |
| 32922: | 0x809a | (213, 107) | 0.502347417840376 |
| 32923: | 0x809b | (211, 106) | 0.502369668246445 |
| 32924: | 0x809c | (211, 106) | 0.502369668246445 |
| 32925: | 0x809d | (209, 105) | 0.502392344497608 |
| 32926: | 0x809e | (207, 104) | 0.502415458937198 |
| 32927: | 0x809f | (207, 104) | 0.502415458937198 |
| 32928: | 0x80a0 | (205, 103) | 0.502439024390244 |
| 32929: | 0x80a1 | (203, 102) | 0.502463054187192 |
| 32930: | 0x80a2 | (203, 102) | 0.502463054187192 |
| 32931: | 0x80a3 | (201, 101) | 0.502487562189055 |
| 32932: | 0x80a4 | (201, 101) | 0.502487562189055 |
| 32933: | 0x80a5 | (199, 100) | 0.502512562814070 |

Fig. 3

| Decimal Value | T_ON Value | PER Value |
|---|---|---|
| 0.501960 | 128 | 255 |
| 0.501976 | 127 | 253 |
| 0.501992 | 126 | 251 |
| 0.502008 | 125 | 249 |
| 0.502024 | 124 | 247 |
| 0.502040 | 123 | 245 |
| 0.502057 | 122 | 243 |
| 0.502074 | 121 | 241 |
| 0.502092 | 120 | 239 |
| 0.502109 | 119 | 237 |
| 0.502127 | 118 | 235 |
| 0.502145 | 117 | 233 |
| 0.502164 | 116 | 231 |
| 0.502183 | 115 | 229 |
| 0.502202 | 114 | 227 |
| 0.502222 | 113 | 225 |
| 0.502242 | 112 | 223 |
| 0.502262 | 111 | 221 |
| 0.502283 | 110 | 219 |
| 0.502304 | 109 | 217 |
| 0.502325 | 108 | 215 |
| 0.502347 | 107 | 213 |
| 0.502369 | 106 | 211 |
| 0.502392 | 105 | 209 |
| 0.502415 | 104 | 207 |
| 0.502439 | 103 | 205 |
| 0.502463 | 102 | 203 |
| 0.502487 | 101 | 201 |
| 0.502512 | 100 | 199 |

| Decimal values | PER / T_ON | Difference with previous decimal value |
|---|---|---|
| 0.497872340425532 | (234, 117) | 18.10⁻⁶ |
| 0.497890295358650 | (236, 118) | 17.10⁻⁶ |
| 0.497907949790795 | (238, 119) | 18.10⁻⁶ |
| 0.497925311203320 | (240, 120) | 17.10⁻⁶ |
| 0.497942386831276 | (242, 121) | 17.10⁻⁶ |
| 0.497959183673469 | (244, 122) | 16.10⁻⁶ |
| 0.497975708502024 | (246, 123) | 16.10⁻⁶ |
| 0.497991967871486 | (248, 124) | 16.10⁻⁶ |
| 0.498007968127490 | (250, 125) | 16.10⁻⁶ |
| 0.498023715415020 | (252, 126) | 16.10⁻⁶ |
| 0.498039215686275 | (254, 127) | 1961.10⁻⁶ |
| 0.500000000000000 | (255, 128) | 1960.10⁻⁶ |
| 0.501960784313725 | (254, 128) | 16.10⁻⁶ |
| 0.501976284584980 | (252, 127) | 16.10⁻⁶ |
| 0.501992031872510 | (250, 126) | 16.10⁻⁶ |
| 0.502008032128514 | (248, 125) | 16.10⁻⁶ |
| 0.502024291497976 | (246, 124) | 16.10⁻⁶ |
| 0.502040816326531 | (244, 123) | 17.10⁻⁶ |
| 0.502057613168724 | (242, 122) | 17.10⁻⁶ |
| 0.502074688796680 | (240, 121) | 18.10⁻⁶ |
| 0.502092050209205 | (238, 120) | 17.10⁻⁶ |
| 0.502109704641350 | (236, 119) | 18.10⁻⁶ |
| 0.502127659574468 | (234, 118) | |

Fig. 6

GENERATION METHOD OF A VARIABLE ANALOGUE SIGNAL GENERATED BY A PWM SIGNAL AND SYSTEM GENERATING SUCH A SIGNAL

FIELD OF THE INVENTION

This application claims the benefit under 35 U.S.C. 119 of French Patent Application 0756080 filed Jun. 27, 2007.

The present invention relates to a method for generating a variable analogue signal generated from a PWM signal, and a system generating such a signal.

BACKGROUND

Generators of DC voltage from a Digital to Analogue Converter (DAC) are known. A Central Processing Unit (CPU) controls the converter by introducing a digital value of determined precision into an input register. If the value is expressed on 8 bits, 256 values are possible and as a result the precision will be 1/256, that is 0.4%. If for example, the voltage varies from 0 volts to 10 volts, the voltage difference from one value to another is 0.04 volts. Commonly found on the market are DACs with 16 bit registers, the central processing unit can introduce 65,536 different values and the precision goes to 0.0015%. Taking the same example as previously with a voltage varying from 0 volts to 10 volts, two consecutive values present a difference of 0.15 millivolts.

The price of the DACs increases as the precision is increased and the conversion time is more rapid. If a rapid conversion time is not required, the Pulse Width Modulator (PWM) signals enable supply of an analogue voltage from a digital magnitude. A PWM signal is a periodic digital signal for which the period at "1" of the signal is variable within the total period. The period of the signal at "1" is called the cyclic ratio. A base clock supplies the base period. Take as an example the PWM signal generator having an 8-bit program register in which the value "1" is programmed, the digital signal obtained is at "1" for a single base pulse and at "0" during the following 255 base pulses. The digital output of the PWM signal is connected to a RC integrator network that smoothes out the variations. A continuous value is thus obtained that can be amplified to control a motor for example.

This type of assembly is commonly found in regulation systems, to modulate the brightness of a lamp or control the speed of a ventilation fan. This latter example is found particularly in television decoders. In fact, these electronic devices consume a great deal of energy during normal operation. This energy is transformed into heat that is concentrated within devices that are generally sealed. If it is not evacuated this heat provokes an accelerated aging of electronic components that results in irreversible deterioration. To prevent this, a ventilator is positioned close to air inlets in the casing of the decoder to accelerate exchanges with the exterior and improve cooling. But using a ventilator at full speed is noisy. If the device is placed in a room, the sound level can be disturbing. Experimentation has shown that it is not the speed that is audible but rather the variation in speed. A ventilator requires a minimal voltage to start, for example 5 volts for a maximum authorized voltage of 10 volts. If, a ventilator is controlled by a PWM signal, only digital values enabling generation of a voltage between 5 and 10 volts can be used. For an 8-bit PWM generator, these values are comprised between 128 and 255, that results in 128 possible values. As a result, the precision of such a device is 1:128 or 0.8% on the range of usable voltages. When the values are introduced into the PWM generator and a continuous voltage has thus been produced, the progression of one value to a next value is audible, especially when this variation intervenes regularly as is the case if a control system is used. In addition, different ventilator models are possible for a same device. If a servo system is used, the ventilators do not need to have the same characteristics, as a result the control system specific to the device must possess an extensive control range and a therefore a high level of accuracy over the entire range.

One solution consists in increasing the number of bits to program the PWM cyclic ratio, for example 12 bits, the precision is then at 0.025%. Assuming the same conditions as previously, the result is a precision of 0.05% that suits perfectly for reducing the audibility of the variations. But a 12-bit PWM is costly and takes longer to program than a PWM using values on 8 bits.

The document US 2007/098374—FUJIWARA published on May 3, 2007 describes a ventilator control system. A control unit 23 sends a PWM signal to the ventilator 22. A tachymetric probe detects the rotation speed of the ventilator and transmits it to the control unit 23. The system can control the temperature of a laptop computer. FIG. 7 of this document informs to use a frequency of 20 kHz for speeds greater than 5,000 rpm by applying a cyclic ratio varying from 70 to 100%, a frequency of 30 kHz for speeds between 4,000 and 5,000 rpm by applying a cyclic ratio varying from 50 to 70% and, a frequency of 40 kHz for speeds less than 4,000 rpm by applying a cyclic ratio varying from 25 to 50%. This document describes a direct correlation between the speed and the cyclic ratio value. The accuracy thus depends solely on that of the cyclic ratio.

The document U.S. Pat. No. 6,487,246—HOELD published on Nov. 26, 2002 describes the internal structure of a PWM signal generator. It is possible to separately program the number of clock pulses for the period and the number of clock pulses for the cyclic ratio of the PWM signal. This document specifies that if the programming of the two registers is carried out at the time of the generation of a new signal, this signal can be contain errors. The solution to this problem consists in synchronizing the update of the registers with the establishment of PWM periods, but this solution cannot increase the accuracy of the analogue signal generated.

The present invention enables a DC voltage to be generated from a more precise PWM signal without increasing the number of cyclic ratio programming bits.

SUMMARY OF THE INVENTION

One of the aims of the present invention is a method to generate a variation form of an analogue signal produced by a succession of generation steps of a PWM signal from pairs of given period and cyclic ratios, the PWM signal being integrated to produce the analogue signal, wherein during the generation of the variation form, pairs having different period values and cyclic ratios are successively applied to generate the PWM cycle, together with the pairs having different periods with the same cyclic ratio.

In this way, in choosing a succession of pairs formed from a certain cyclic ratio and a certain period value, an analogue signal can be generated whose variations are smaller that if the variation consists only in varying the cyclic ratio. Between two successively generated PWM signals, the period or the cyclic ratio can be varied, or both. This can obtain a greater number of digital values produced by the ratio between the cyclic ratio and the period, and thus, supply a large number of different analogue values. Hence, the accuracy to obtain a determined value is greater. Notably, a signal can thus be generated whose evolution is much more linear over time.

According to a first improvement, each generation step comprises an extraction step from a recorded table of a pair of period values and a cyclic ratio, the address of the extracted pair being the command value to generate the analogue signal. In this way, the search for a pair of values within a table is performed rapidly.

According to another improvement, each generation step comprises an extraction step from a recorded table of a pair of period values and a cyclic ratio, each pair of values being associated with a digital value. The pair extracted from the table is the one whose associated digital value is closest to the analogue signal to generate. In this way, the table contains only different digital values, thus preventing that table from containing duplicate values.

According to an improvement, the PWM signal generation steps are applied over equal times. In this way, the chronology of the steps is performed with great simplicity. According to a variant, the PWM signal generation steps are applied over time slots whose duration is the result of a mathematical formula. In this way, it is possible to vary the form of the variation thus generated using time. According to another variant, the PWM signal generation steps are applied over periods varying according to the difference between the associated digital value extracted from the table and the digital value that follows in the order of the table. In this way it is possible to compensate for the lack of precision of certain values.

According to another improvement, if several cyclic ratio and period pairs produce an identical result, the couple having the highest period value is selected. In this way, it is possible to apply pairs of values of period and cyclic ratio having close period values, which reduces the amplitude of some artifacts. According to another improvement, the analogue magnitude is a command signal controlling a ventilator speed.

Another aim of the present invention is a device to generate a variation form of an analogue signal, comprising a generator of PWM signals whose period and cyclic ratio are programmable and a circuit of integration of said signal to produce the analogue signal, Wherein during the generation of the variation form, a plurality of pairs having different values of period and cyclic ratio are successively applied to the generator to produce the variation form, as well as pairs having different periods with the same cyclic ratio.

BRIEF DESCRIPTION OF THE DRAWINGS

Other characteristics and advantages of the present invention will emerge from the description of the following embodiments to be taken as non-restrictive examples, made with reference to the figures attached wherein:

FIG. 3 presents an example of a correspondence table enabling extraction of period and cyclic ratio pairs in order to generate a variable analogue signal, FIG. 6 shows an extract of a correspondence table containing associations between a decimal value and a period and a cyclic ratio pair, in a zone of low linearity,

DETAILED DESCRIPTION

Figure 1:
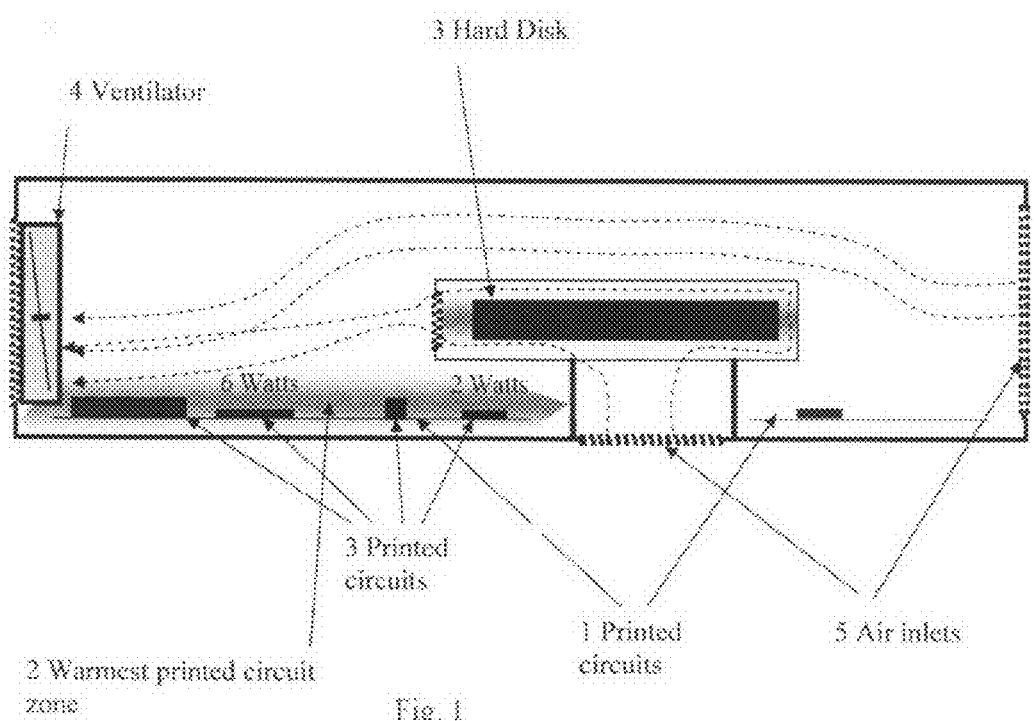
FIG. 1 shows a section of an electronic device according to an embodiment of the invention.

FIG. 1 describes a section of an electronic device, a television decoder for example. The device comprises a printed circuit 1 on which the electronic circuits 2 are arranged. A hard disk 3 enables recording of data, particularly of lengthy audiovisual works. The circuits 2 and the hard disk 3 consume a large amount of energy and release heat. For example, the CPU of the decoder 2 typically releases approximately 6 watts of energy. As a result, certain zones of the decoder, marked in grey on the FIG. 1, are warmer than others. A ventilator 4 extracts hot air from the decoder cavity. Two ventilation air-inlets 5 cut into the decoder casing enable two cool air inlets. Curved arrows show the path of the air flows. The number, the position and the size of the air-inlets are important elements of good ventilation, these parameters being well known to those skilled in the art.

Figure 2:
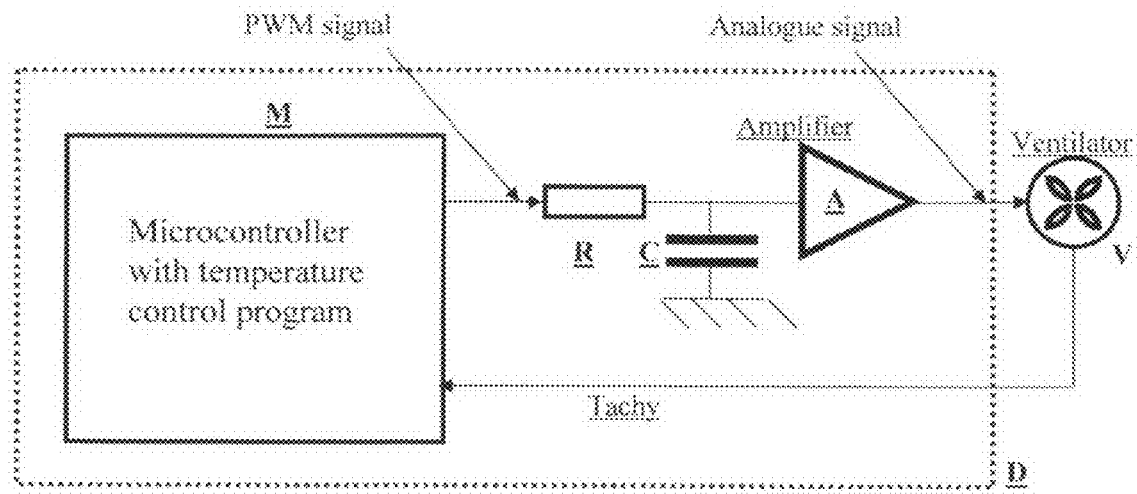
FIG. 2 illustrates a generation system of a variable analogue signal according to a preferred embodiment.

FIG. 2 illustrates a generation device D of an analogue signal enabling control of the speed of the ventilator V according to a preferred embodiment of the invention. This figure is applicable to all generation systems of an analogue signal that receives a digital value at the input and supplies a PWM (Pulse Width Modulator) signal at the output. In the embodiment described, the management unit M is one of the circuits 2 of the board or part of a circuit 2, its function is to maintain the speed of the ventilator as close as possible to a set speed. The management unit M has a digital input to receive signals representative of the ventilator speed (these signals are generally called "Tachy") and a command output to control the ventilator 4 or V on FIG. 2. The Tachy signal is a pulse signal, the number of pulses per unit of time determines the real speed of the ventilator. According to the value of the Tachy signal, the management unit 6 calculates the ventilator speed V and enables eventual corrections to maintain the speed as close as possible to the set speed. In this way, the ventilator speed is servo-controlled. In other systems, it is the analogue signal itself that is servo-controlled, this is the case for example when the device is an adjustable DC generator.

A PWM signal is a periodic digital signal that can be converted to an analogue signal using a means of integration, typically a low-pass filter comprising a resistor R and a capacitor C. In the embodiment, the analogue signal whose power is amplified by an amplifier A controls a ventilator V. In a known manner, the period is fixed and the amplitude of the analogue signal varies according to the cyclic ratio. According to an embodiment, the cyclic ratio of the PWM is coded on 8 bits. The applied analogue voltage can theoretically vary between 0 and 12 volts, but generally the ventilator does not rotate for a voltage less than approximately 5 volts, and becomes too noisy if greater than 9 volts. As a result, the useful range of motor command values varies for a PWM signal defined by 8-bit values between approximately 120 to 180 which constitute sixty useful values. A unit variation causes a large amplitude variation that becomes easily audible. It is clear that other values coded by more or less than 8 bits are possible, the number of bits is only given here by way of an example.

The PWM signal generation circuit generates a periodic digital signal whose cyclic ratio and period is variable. A base clock supplies a square wave signal with a frequency of 27 MHz, then this signal is according to a certain ratio to obtain the period of the PWM signal. Typically, the PWM signal generator has two registers of 8-bit programs, one to introduce the "PER" value representing the number of time units of the period of the PWM signal, and the other to introduce the cyclic ratio, that is the "T_ON" value representing the number of times that the PWM signal is at "1". So, to obtain a PWM signal having at least one time period at "0", it is strictly necessary that T_ON be less than PER. For example, if the period register contains the value PER=100 and the cyclic ratio register contains the value T_ON=64, then the generated signal has a frequency one hundred times less than the base frequency and the period during which the digital value is at "1," is three times shorter than that for which the digital value is at "0".

If the period value is not modified, the number of possible values to generate a signal is 256, but practically the usable values are from 120 to 180, which enables a precision in the order of 1.5% to regulate the ventilator speed. According to the present invention, by modifying both the PER values and T_ON a lot more than 256 possible values are obtained, and so, there is a very high number of pairs finally enabling as many different voltage values to be generated.

By respecting the rule T_ON≦PER, the following are obtained:

If PER=255, then 256 values are possible for T_ON.
If PER=254, then 255 values are possible for T_ON.
If PER=253, then 254 values are possible for T_ON.
...
If PER=2, then 3 values are possible for T_ON (0, 1 or 2).
If PER=1, then 2 values are possible for T_ON (0 or 1): the signal is then continuously at "0" or "1".

The null value for PER has no meaning.

The possible number of pairs is the result of an arithmetic progression for which the formula is Σ=255×((1+255)/2) =32640 different (T_ON/PER) pairs.

According to a first simple embodiment, the generation system of an analogue signal calculates values on 16 bits to control the ventilator, given that the maximum decimal value is 32,640. the generation system creates a correspondence table supplying a pair (T_ON/PER) to apply, for a given command value. This table of 32,640 values is an ordered list of pairs of data (T_ON/PER) of 8 bits. Advantageously, it is possible to reduce the table so that it contains a number equal to a power of 2, for example 2 to the power of 14 or 2 to the power of 12. Certain pairs (T_ON/PER) disappearing as their decimal values are very close to other values maintained on the table. The memory zone occupied by the table is thus optimized.

Whatever the size of the table, the search for a pair (T_ON/ PER) is performed by applying to the address the command value on 16 bits, 14 bits or 12 bits, the addressed pair is then read and used to program the two registers of the PWM generator. Here is how the table values are written: initially, all decimal values between 0 and 1 obtained by all the ratio combinations (T_ON) on (PER) are calculated to a very high degree of precision (typically 10 decimals). The decimal values are ordered from the smallest (0.00000) to the largest (1.000000) and the corresponding pairs (T_ON/PER) are arranged in the same order. Then a table precision is given, for example 16 bits=N. The $2^N$ theoretical values $i/2^N$ are calculated where i varies from 1 to $2^N$=65,536. 65,536 values varying from 0 to 1 are obtained. Each theoretical value is then associated with the closest decimal value calculated from the pair (T_ON/PER) and the table is filled in this manner.

An extract of an example of such a table is given in FIG. 3. FIG. 3 shows four columns, only column 3 is actually recorded in the memory. The first and second column contain values on 16 bits, in decimal and hexadecimal of the index of each line of the table, given that the previously cited theoretical value is the inverse of this value on 16 bits. Column 3 specifies the pair (PER/T_ON) enabling programming of the two registers "PER" and "T_ON" of the PWM M signal generator. The last column shows the decimal value obtained by calculating the pair (T_ON/PER), this decimal value is the input parameter of the amplifier that commands the ventilator. This last column enables taking into account the precision obtained by varying different consecutive pairs (T_ON/PER) in the table. It is then easy to see that the joint programming of the two 8-bit registers controlling the period and the cyclic ratio, enable obtaining of an analogue value of a precision of approximately 15 bits. It is noted that in certain cases, there is only a single decimal value, and so a single pair for several theoretical values.

When the analogue signal generation system produces a command value on 16 bits, it indicates the table with this value and immediately reads the pair (T_ON/PER) to program the registers. To generate a continuous variation of an analogue signal, it is possible to go from a DEBUT value of 16 bits to a value FIN, while reading from the table all the pairs (T_ON/PER) comprised between DEBUT and FIN, and applying regular times to the intervals.

It is observed that the decimal values generated by certain pairs are identical: $1/2=2/4=4/8=8/16=16/32=32/64=64/128$. The calculation shows that there are 19,947 pairs T_ON/PER producing different decimal values.

It appears particularly interesting to memorize only pairs (T_ON/PER) producing different analogue signal values. It is therefore possible to reduce the size of the table.

According to an embodiment variant, the table in the memory is modified so that it contains only differing decimal values. It has been seen that the set of pairs (T_ON/PER) producing different decimal values is 19,947, it is therefore unnecessary to keep duplicates in the table. According to the variant, the analogue signal generation system calculates the decimal values varying between 0 and 1, with, for example, 6 decimal points. The use of six decimals offers a good compromise, it depends upon the number of register bits. The table in the memory contains the 19,947 possible results ordering them from the lowest value (0) to the highest (1) with a precision of six decimal points. According to a variant, the correspondence table associates decimal values with a given pair. In order to optimize the table size, care is taken to retain only differing decimal values. If, as seen previously, several pairs produce the same result, only the pair possessing the highest period value is retained to be memorized in the table. In this way, the various pairs that succeed each other to generate the form or variation of an analogue signal, will have close period values (these values all have period values between 128 and 255), which avoids eventual artifacts produced by exchanges between PWM signals with very short periods and PWM signals with very long periods. As shown by FIG. 6, two consecutive pairs can have either a different period and cyclic ratio, or the same period and a different cyclic ratio, or the same cyclic ratio and a different period. Finally, this can obtain a greater number of digital values produced by the ratio between the cyclic ratio and the period, and thus, supply a large number of different analogue values.

Figure 4:
FIG. 4 presents another example of the correspondence table containing associations between a decimal value and a period and cyclic ratio pair.

FIG. 4 presents an extract of such a table according to an embodiment. The extract relates to a window of decimal values comprised between 0.501960 and 0.502512. Between these two values, 25 different pairs are found, defined by a value T_ON (column 2) and a period PER (column 3). Column 4 gives a value on 16 bits, in hexadecimal equivalent of the decimal value of the first column considering that the value "H10000" is equal to "1". This last value shows the level of imprecision of the variable signal expressed by a value on 16 bits. It is seen therefore that almost all the values on 16 bits are represented with a few exceptions: H808C, H8091, H8095, H8099, H809C, H809F, H80A2, H80A4. In fact, for these values, there are no near pairs, so another value on 16 bits must be used.

According to this variant, the management unit M calculates the decimal values to command the ventilator, these values are comprised between 0 and 1 and have a precision of at least five decimal points. For each new return decimal value, the management system searches for the pair (T_ON/PER) whose associated decimal value is closest to the return value. The table search illustrated by FIG. 4 is carried out in a very classic manner, it can draw upon sorting algorithms enabling the placing of a certain value among an ordered set of values. One method, for example, consists in first aiming for the middle of the table, to determine if the given value is lower or higher, and according to the response to aim for the middle of the lower or higher half of the table. And so on, until the value in the table is found whose difference from the returned value is the smallest. Once this value has been found, the corresponding pair (T_ON/PER) is read and the values on 8 bits are entered in the two registers. In this way, the analogue signal generated has a high degree of precision. For example, let us assume a returned value equal to 0.502 volts, the closest decimal value present in the correspondence table is 0.502008, that corresponds to the pair (T_ON/PER)=125/249, the bold arrow in FIG. 4 indicates the closest value found. The generating circuit will write 125 in the cyclic ratio register and 249 in the period register.

Figure 5:
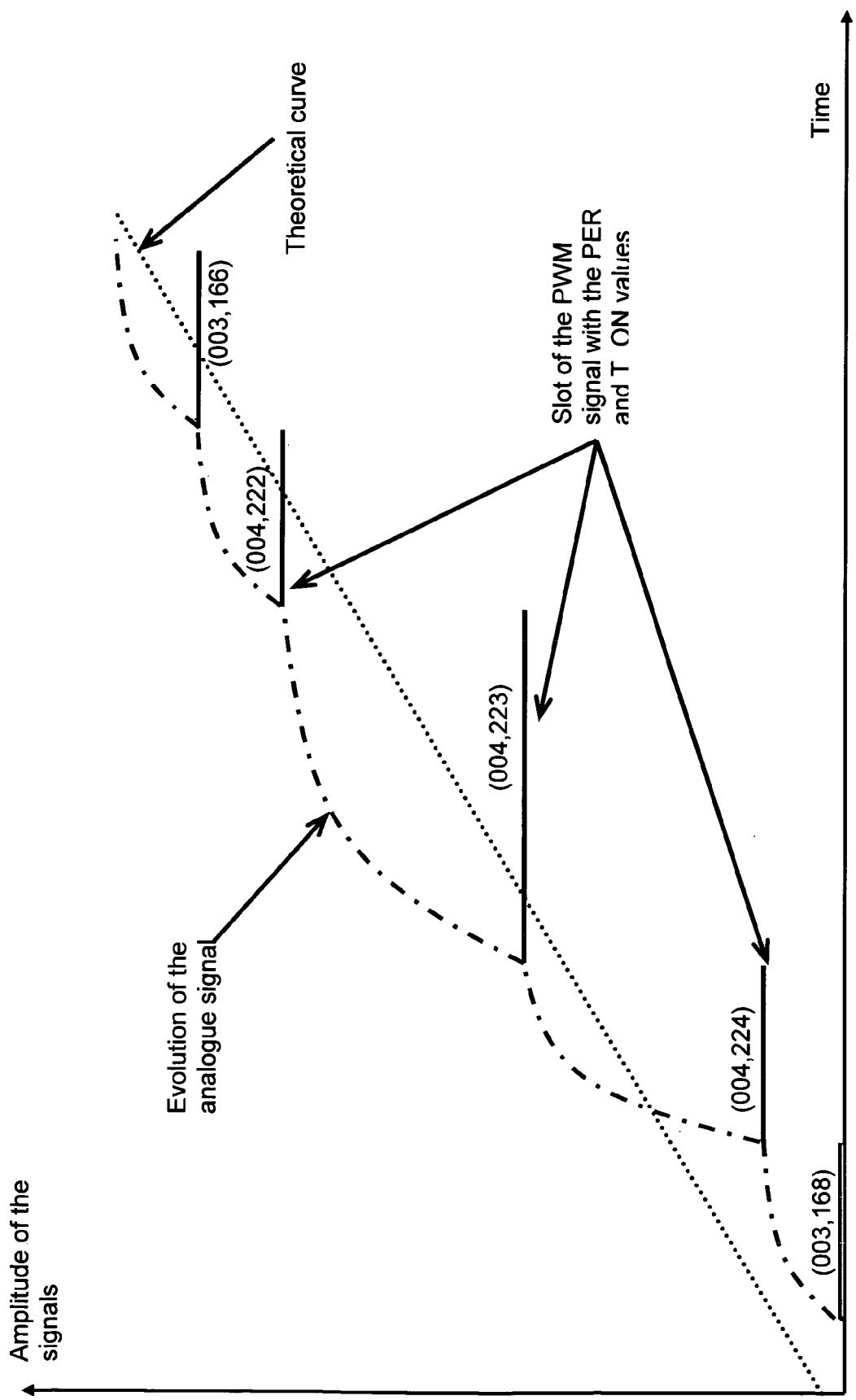
FIG. 5 represents a successive application of PWM signals of different parameters in order to generate a variable analogue signal.

FIG. 5 shows a timing diagram of PWM signals and of a linear variation analogue signal obtained by the method that has just been described. The timing diagram shows the signals produced by the PWM generator and the low-pass filter for the pairs (T_ON/PER) whose decimal values are comprised between 0.0177541 and 0.017964. Five different pairs are found in this range, but certain pairs are represented several times in the table of FIG. 3. Hence, the first pair (003, 168) present three times in the table, is applied during 3 time units, the second pair (004, 224) is applied during 3 time units, the third pair (004, 223) is applied during 6 time units, the fourth (004, 222) is applied during 3 time units and the last (003, 166) is applied during 3 time units. FIG. 5 also presents in scale the level of decimal values corresponding to the generated pairs (T_ON/PER), these values varying from 0.0177514 to 0.0179640. The theoretical straight line is represented. The dotted line shows the evolution of the analogue signal after amplifier A, it can be seen that this line follows globally the evolution of a straight line.

According to a simple embodiment, the analogue signal generation system extracts the values T_ONi and PERi from the correspondence table during determined time slots and writes them into the two PWM control registers. In this way, the generated analogue signal is progressively equal to the required value passing in by numerous different discrete values, the great number of these values enabling very low variations as well as great precision and in the case of the control of a ventilator, a notable noise reduction. The time interval between two pair (T_ONi/PERi) applications depends particularly on the duration spent waiting for the new value. Let $\Delta T$ be the time to obtain the new nominal value, let $V_{ini}$ be the initial value and $V_{target}$ the decimal value to obtain, the system divides $\Delta T$ by the number of values enabling the acquisition of this target decimal value in order to determine the time value around which each pair (T_ONi/PERi) extracted from the table is applied. As shown in FIG. 5, in applying during an identical time period, each pair (T_ONi/PERi) read in the table illustrated by the FIG. 3, an almost linear varying analogue signal is obtained.

Assume that the analogue signal generation system must produce a linear varying analogue signal of 6.024 volts to 6.030 volts to control ventilator V. The circuit delivering a maximum voltage of 12 volts, the decimal value to supply to the analogue circuits varies from 0.502 to 0.5025. The correspondence table illustrated in FIG. 3 supplies a first value pair of 125/249 and a last pair of 100/199 that supplies the target value. Between these two values, 32 values are found thus defining 33 time slots. By starting hypothesis, the time to progress from a voltage of 6.00 volts to 6.10 volts is one second, so each pair is applied for 1/33 seconds, the last pair (100/199) being continuously applied.

An example of a variation form of an analogue signal, typically a straight line, is seen in FIG. 5. This variation form is produced by successively programming 5 pairs (T_ONi/PERi) at the PWM generator. If the programming of parameters extracted from the table represented in FIG. 3 is carried out at constant time slots, each analogue value thus generated is applied over time slots that are multiples of elementary time slots. According to an improvement, it is possible to obtain a non-linear variation by varying the duration of application of each new value. For example, the value of the application time of a pair can be the image of a refined function of a general equation $\Delta Ti = A \times i + B$, where "i" is the order number of the pair (T_ONi/PERi) extracted from the correspondence table. Using this formula, values will rapidly succeed each other at first then will be applied more and more slowly at the end. In this way, the generated analogue signal presents a great variation at the start and a low variation as it approaches the target decimal value. This enables the variations to be accelerated at the beginning and the target value to be obtained more smoothly.

Other embodiments are possible, where the application time value of a pair is obtained by a more complex equation, notably of $2^{nd}$ degree.

It is noted that the temporal differences between the application of two different pairs (T_ONi/PERi) to generate a variation form are not the same, this is due to the production of discrete decimal values that do not offer the same difference between them. FIG. 5 illustrates this phenomenon: certain pairs are applied once, three times, five times. The number of applications of each pair is calculated according to the proximity of decimal values calculated according to a theoretical value $i/2^N$ where i varies from 1 to N. It is possible to improve the precision by varying the duration of the application of each new value according to its difference in relation to the following value. FIG. 6 shows an extract of the correspondence table of the same type as that of FIG. 4 in a sector where very punctual large variations from one decimal value to another, are observed. For values inferior to 0.498039, the variations are situated between 16.10-6 and 18.10-6, whereas around the decimal value 0.5 the differences increase considerably: 1961.10-6. Then, for values greater than 0.501960, the variations are once again situated between 16.10-6 and 18.10-6. If to produce a linearly variant signal, the generation system applies pairs (T_ONi/PERi) successively extracted from the table over the same time slots, these differences lead to a non-linearity with respect to the theoretical straight line, especially around the decimal value 0.5.

To reduce the differences, the period in which a given pair (T_ON/PER) generates an analogue signal depends upon its difference with the following pair. If Ttotal is the time to obtain the new nominal value and Etotal the difference between the actual value and this nominal value, the ratio (Etotal/Ttotal) represents the value derived from the signal frame to be generated to obtain the new nominal value in a linear manner. For Vi, Vi+1 two consecutive decimal values extracted from the table, ΔV is the difference between Vi and Vi+1:

$$\Delta V = Vi+1 - Vi$$

The value derived from the variation ΔV must be the same as the ratio (Etotal/Ttotal), and other terms:

$$\Delta Vi/\Delta Ti = Etotal/Ttotal$$

The value Etotal/Ttotal is known and is constant, ΔV that is equal to Vi+1−Vi is deduced from the table, the unknown ΔTi is calculated by the formula:

$$\Delta Ti = \Delta Vi/(Etotal/Ttotal).$$

As a result, the duration of the pair application (T_ONi/PERi) generating a value Vi depends on the difference between this value and the following value in the table. If, for example, the management system M produces an analogue signal in the form of a ramp varying linearly between the decimal values 0.4980 and 0,5020 during 1 second, then the following ratios will be applied during the following times:

(T_ON/PER)=125/250 applied during: 4 ms,
(T_ON/PER)=126/252 applied during: 4 ms,
(T_ON/PER)=127/254 applied during: 492 ms,
(T_ON/PER)=128/255 applied during: 492 ms,
(T_ON/PER)=127/252 applied during: 4 ms,
(T_ON/PER)=126/250 applied during: 4 ms,
(T_ON/PER)=125/248 applied continuously:

This solution enables compensation for the non-linear defects in the differences between successive values extracted from the table of FIG. 6.

Those skilled in the art can adapt the present invention into many other specific forms without moving away from the application domain of the invention as claimed. In particular, the generation system can be adapted for the generation of signals of all physical sizes used in electronic devices. Consequently, the present embodiments must be considered as being examples but can be modified in the domain defined by the scope of the attached claims.

The invention claimed is:

1. A generation method of a variation form of an analogue signal produced by a succession of generation steps of a PWM signal from pairs of given period and cyclic ratios, the PWM signal being integrated to produce the analogue signal, wherein during the generation of the variation form, a plurality of pairs having different values of period and cyclic ratio are successively applied to generate the PWM signal, as well as pairs having different periods with the same cyclic ratio, if several pairs of cyclic ratios and periods offer an identical result, the pair having the highest period value is chosen.

2. The generation method of a variation form of an analogue signal according to claim 1, wherein each generation step comprises an extraction step from a table of a pair of period and cyclic ratio values, each pair of values being associated with a digital value, the pair extracted from the table is the pair whose associated digital value is closest to the analogue signal to be generated.

3. The generation method of a variation form of an analogue signal according to claim 2, wherein the generation steps of a PWM signal are applied over times varying according to the difference between the associated digital value extracted from the table and the digital value in the order according to the table.

4. The generation method of a variation form of an analogue signal according to claim 1, wherein the generation steps of a PWM signal corresponding to each pair of period and cyclic ratio values are carried out over equal times.

5. The generation method of a variation form of an analogue signal according to claim 4, wherein if several pairs of cyclic ratios and periods offer an identical result, the pair having the highest period value is chosen.

6. The generation method of a variation form of an analogue signal according to claim 4, wherein the analogue value is a command signal controlling the speed of a ventilator.

7. The generation method of a variation form of an analogue signal according to claim 1, wherein the analogue value is a command signal controlling the speed of a ventilator.

8. A device to generate a variation form of an analogue signal, comprising a generator of PWM signals whose period and cyclic ratio are programmable and a circuit of integration of said signal to produce the analogue signal, wherein during the generation of the variation form, a plurality of pairs having different values of period and cyclic ratio are successively applied to the generator to produce the variation form, as well as pairs having different periods with the same cyclic ratio, if several pairs of cyclic ratios and periods offer an identical result, the pair having the highest period value is chosen.

9. The Generation device of a variation form of an analogue signal according to claim 8, wherein it comprises a table containing pairs of period and cyclic ratio values, a pair of period and cyclic ratio values being extracted from the table to be applied to the generator, each pair of value being associated with a digital value, the pair extracted from the table is the one whose associated digital value is the closest to that of the analogue signal to generate, 10. The Generation device of a variation form of an analogue signal according to claim 9, wherein the device applies the PWM signals corresponding to each pair of period and cyclic values over times varying according to the difference between the associated digital value extracted from the table and the digital value in the order according to the table.

11. The Generation device of a variation form of an analogue signal according to claim 8, wherein the device applies the PWM signals corresponding to each pair of period and cyclic ratio values over equal times.

12. The Generation device of a variation form of an analogue signal according to claim 11, wherein if several pairs of cyclic ratios and periods offer an identical result, the pair having the highest period value is chosen to be used by the generator.

13. The Generation device of a variation form of an analogue signal according to claim 11, wherein the analogue value is a command signal controlling the speed of a ventilator.

14. The Generation device of a variation form of an analogue signal according to claim 8, wherein the analogue value is a command signal controlling the speed of a ventilator.

* * * * *